(12) United States Patent
Yang et al.

(10) Patent No.: US 12,279,446 B2
(45) Date of Patent: Apr. 15, 2025

(54) MANUFACTURING METHOD OF SEMICONDUCTOR DEVICE

(71) Applicant: UNITED MICROELECTRONICS CORP., Hsin-Chu (TW)

(72) Inventors: Tsung-Yu Yang, Chiayi County (TW); Shin-Hung Li, Nantou County (TW); Ruei-Jhe Tsao, New Taipei (TW); Che-Hua Chang, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/645,366

(22) Filed: Apr. 24, 2024

(65) Prior Publication Data
US 2024/0274707 A1     Aug. 15, 2024

Related U.S. Application Data

(62) Division of application No. 17/578,383, filed on Jan. 18, 2022, now Pat. No. 12,002,883.

(30) Foreign Application Priority Data

Dec. 20, 2021 (CN) .......................... 202111560189.6

(51) Int. Cl.
*H10D 30/66* (2025.01)
*H10D 30/67* (2025.01)

(52) U.S. Cl.
CPC ......... *H10D 30/66* (2025.01); *H10D 30/6713* (2025.01); *H10D 30/6755* (2025.01)

(58) Field of Classification Search
CPC ................ H01L 29/7802; H10D 30/66; H10D 30/6713; H10D 30/6755
See application file for complete search history.

(56) References Cited

U.S. PATENT DOCUMENTS

| 5,508,547 A * | 4/1996 | Yang ................... H01L 29/0856 257/341 |
| 6,150,693 A | 11/2000 | Wollesen |
| 7,804,130 B1 | 9/2010 | Fung |
| 8,183,626 B2 | 5/2012 | Chu |
| 9,166,039 B2 | 10/2015 | Landgraf |
| 2001/0032999 A1 | 10/2001 | Yoshida |
| 2009/0057720 A1 | 3/2009 | Kaneko |
| 2010/0244044 A1 | 9/2010 | Li |

(Continued)

*Primary Examiner* — Eugene Lee
(74) *Attorney, Agent, or Firm* — Winston Hsu

(57) ABSTRACT

A semiconductor device includes a semiconductor substrate, a gate structure, a first drift region, a first source/drain region, and a gate oxide layer. The gate structure and the gate oxide layer are disposed on the semiconductor substrate. The first drift region is disposed in the semiconductor substrate. The first source/drain region is disposed in the first drift region. At least a part of a first portion of the gate oxide layer is disposed between the gate structure and the semiconductor substrate in a vertical direction. A second portion of the gate oxide layer is disposed between the first portion and the first source/drain region in a horizontal direction. The second portion includes a bottom extending downwards and a first depressed top surface located above the bottom. A part of the first drift region is located under the first portion and the second portion of the gate oxide layer.

8 Claims, 10 Drawing Sheets

(56) References Cited

U.S. PATENT DOCUMENTS

| | | | |
|---|---|---|---|
| 2012/0070954 A1* | 3/2012 | Fung | ................... H01L 29/6659 |
| | | | 438/303 |
| 2014/0231911 A1 | 8/2014 | Kim | |
| 2017/0200788 A1* | 7/2017 | Gotoh | ................. H01L 29/4236 |
| 2017/0263763 A1 | 9/2017 | Ryu | |
| 2020/0365725 A1 | 11/2020 | Ueno | |
| 2022/0085210 A1 | 3/2022 | Hsiung | |

* cited by examiner

MANUFACTURING METHOD OF SEMICONDUCTOR DEVICE

CROSS REFERENCE TO RELATED APPLICATIONS

This application is a division of U.S. application Ser. No. 17/578,383, filed on Jan. 18, 2022. The content of the application is incorporated herein by reference.

BACKGROUND OF THE INVENTION

1. Field of the Invention

The present invention relates to a semiconductor device and a manufacturing method thereof, and more particularly, to a semiconductor device including a gate oxide layer and a manufacturing method thereof.

2. Description of the Prior Art

Double-diffused MOS (DMOS) transistor devices have drawn much attention in power devices having high voltage capability. The conventional DMOS transistor devices are categorized into vertical double-diffused MOS (VDMOS) transistor device and lateral double-diffused MOS (LDMOS) transistor device. Having advantage of higher operational bandwidth, higher operational efficiency, and convenience to be integrated with other integrated circuit due to its planar structure, LDMOS transistor devices are prevalently used in high operation voltage environment such as CPU power supply, power management system, AC/DC converter, and high-power or high frequency band power amplifier. The essential feature of LDMOS transistor device is a lateral-diffused drift region with low doping concentration and large area. The drift region is used to alleviate the high voltage between the drain and the source, and therefore LDMOS transistor device can have higher breakdown voltage. However, as the requirements of related products become higher and higher, how to improve the characteristic such as the electrical performance and/or the distribution density of high voltage semiconductor units through design modifications in structure and/or process is still a continuous issue for those in the relevant fields.

SUMMARY OF THE INVENTION

A semiconductor device and a manufacturing method thereof are provided in the present invention. A gate oxide layer including a bottom extending downwards and a depressed top surface located corresponding to the bottom and a drift region partly disposed under the gate oxide layer are used to improve related electrical performance of the semiconductor device and/or reduce the area occupied by the semiconductor device.

According to an embodiment of the present invention, a semiconductor device is provided. The semiconductor device includes a semiconductor substrate, a gate structure, a first drift region, a first source/drain region, and a gate oxide layer. The gate structure and the gate oxide layer are disposed on the semiconductor substrate. The first drift region is disposed in the semiconductor substrate and located at a side of the gate structure. The first source/drain region is disposed in the first drift region. The gate oxide layer includes a first portion and a second portion. At least a part of the first portion is disposed between the gate structure and the semiconductor substrate in a vertical direction. The second portion is disposed between the first portion of the gate oxide layer and the first source/drain region in a horizontal direction. The second portion of the gate oxide layer includes a bottom extending downwards and a first depressed top surface located above the bottom in the vertical direction. A part of the first drift region is located under the first portion of the gate oxide layer and the second portion of the gate oxide layer in the vertical direction.

According to an embodiment of the present invention, a manufacturing method of a semiconductor device is provided. The manufacturing method includes the following steps. A first drift region is formed in a semiconductor substrate. A gate oxide layer is formed on the semiconductor substrate. A gate structure is formed on the gate oxide layer, and the first drift region is located at a side of the gate structure. A first source/drain region is formed in the first drift region. The gate oxide layer includes a first portion and a second portion. At least a part of the first portion is disposed between the gate structure and the semiconductor substrate in a vertical direction. The second portion is disposed between the first portion of the gate oxide layer and the first source/drain region in a horizontal direction. The second portion of the gate oxide layer includes a bottom extending downwards and a first depressed top surface located above the bottom in the vertical direction. A part of the first drift region is located under the first portion of the gate oxide layer and the second portion of the gate oxide layer in the vertical direction.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-7 are schematic drawings illustrating a manufacturing method of the semiconductor device according to the first embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, and FIG. 7 is a schematic drawing in a step subsequent to FIG. 6.

FIG. 9 and FIG. 10 are schematic drawings illustrating a manufacturing method of the semiconductor device according to the second embodiment of the present invention, wherein FIG. 10 is a schematic drawing in a step subsequent to FIG. 9.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "etch" is used herein to describe the process of patterning a material layer so that at least a portion of the material layer after etching is retained. When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
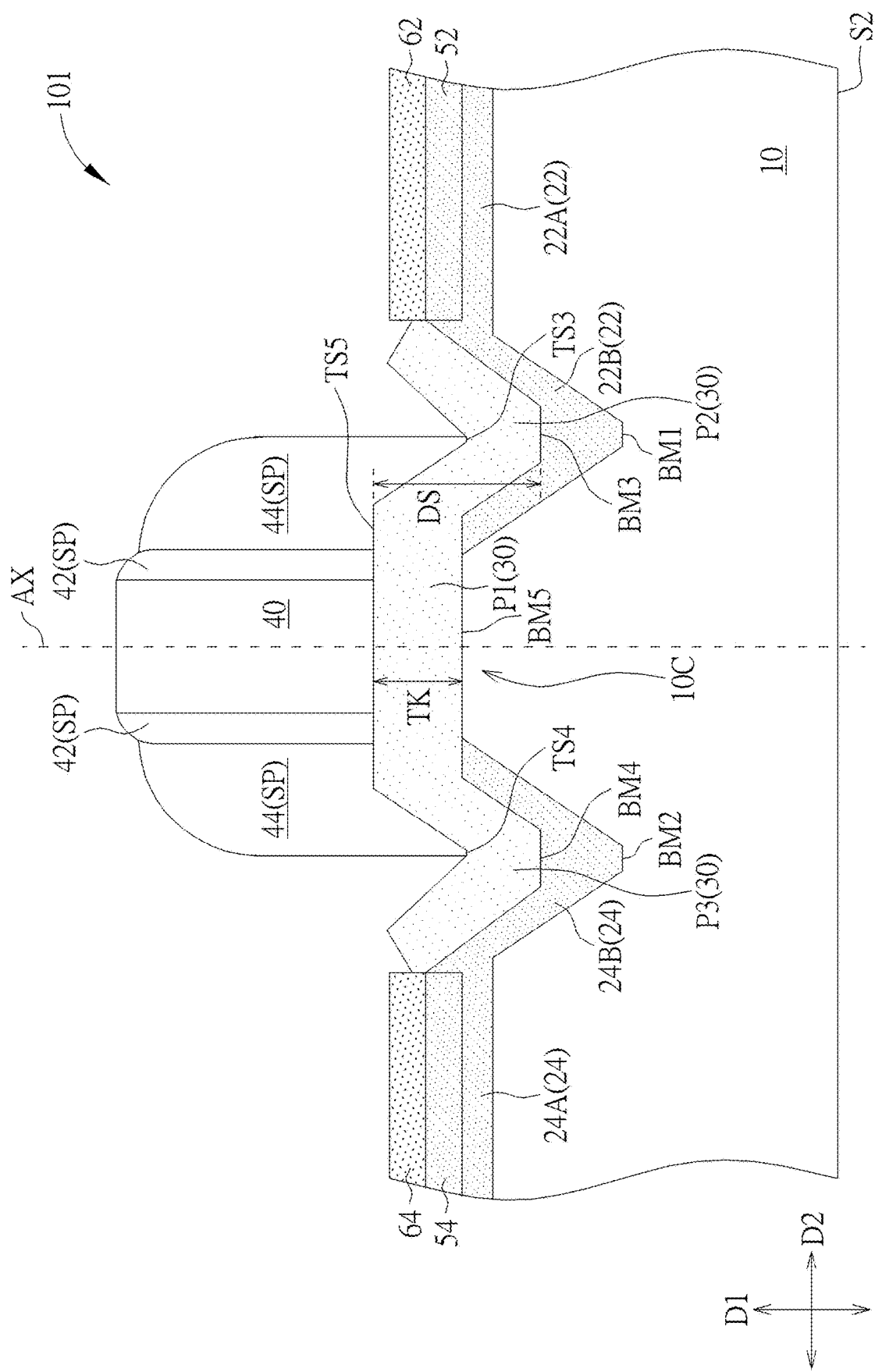
FIG. 1 is a schematic drawing illustrating a semiconductor device according to a first embodiment of the present invention.

Please refer to FIG. 1. FIG. 1 is a schematic drawing illustrating a semiconductor device 101 according to a first embodiment of the present invention. As shown in FIG. 1, the semiconductor device 101 includes a semiconductor substrate 10, a gate structure 40, a first drift region 22, a first source/drain region 52, and a gate oxide layer 30. The gate structure 40 and the gate oxide layer 30 are disposed on the semiconductor substrate 10. The first drift region 22 is disposed in the semiconductor substrate 10 and located at a side of the gate structure 40. The first source/drain region 52 is disposed in the first drift region 22. The gate oxide layer 30 includes a first portion P1 and a second portion P2. At least a part of the first portion P1 is disposed between the gate structure 40 and the semiconductor substrate 10 in a vertical direction (such as a vertical direction D1 shown in FIG. 1 and/or other directions parallel with the vertical direction D1). The second portion P2 is disposed between the first portion P1 of the gate oxide layer 30 and the first source/drain region 52 in a horizontal direction (such as a horizontal direction D2 shown in FIG. 1 and/or other directions parallel with the horizontal direction D2). The second portion P2 of the gate oxide layer 30 includes a bottom BM3 extending downwards and a first depressed top surface (such as a top surface TS3 shown in FIG. 1) located above the bottom BM3 in the vertical direction D1. A part of the first drift region 22 is located under the first portion P1 and the second portion P2 of the gate oxide layer 30 in the vertical direction D1. The current path in the first drift region 22 located under the gate oxide layer 30 may extend downwards in the vertical direction D1 by the second portion P2 of the gate oxide layer 30 including the bottom BM3 extending downwards and the first depressed top surface located corresponding to the bottom BM3. The electrical performance of the semiconductor device 101 may be improved (such as reducing edge electrical field, enhancing endurance of hot carrier injection, and so forth, but not limited thereto) by elongating the current path accordingly, and/or the area occupied by the first drift region 22 and the area occupied by the semiconductor device 101 may be relatively reduced under the requirement of a specific current path for increasing the amount and/or the distribution density of the semiconductor device 101.

In some embodiments, the vertical direction D1 described above may be regarded as a thickness direction of the semiconductor substrate 10, and the semiconductor substrate 10 may have a top surface (not shown in FIG. 1) and a bottom surface S2 opposite to the top surface in the vertical direction D1. In some embodiments, the gate structure 40 and the gate oxide layer 30 may be disposed on the top surface of the semiconductor substrate 10, and the bottom BM3 of the second portion P2 of the gate oxide layer 30 may be regarded as a bottom protruding and extending toward the bottom surface S2. In addition, horizontal directions (such as the horizontal direction D2 and other directions orthogonal to the vertical direction D1) substantially orthogonal to the vertical direction D1 may be substantially parallel with the top surface and/or the bottom surface S2 of the semiconductor substrate 10, but not limited thereto. In this description, a distance between the bottom surface S2 of the semiconductor substrate 10 and a relatively higher location and/or a relatively higher part in the vertical direction D1 is greater than a distance between the bottom surface S2 of the semiconductor substrate 10 and a relatively lower location and/or a relatively lower part in the vertical direction D1. The bottom or a lower portion of each component may be closer to the bottom surface S2 of the semiconductor substrate 10 in the vertical direction D1 than the top or upper portion of this component. Another component disposed above a specific component may be regarded as being relatively far from the bottom surface S2 of the semiconductor substrate 10 in the vertical direction D1, and another component disposed under a specific component may be regarded as being relatively closer to the bottom surface S2 of the semiconductor substrate 10 in the vertical direction D1.

Specifically, in some embodiments, the first drift region 22 may include a first portion 22A and a second portion 22B. The first portion 22A may be directly connected with the second portion 22B, and the second portion 22B may be located between the gate structure 40 and the first portion 22A in the horizontal direction D2. In addition, the first source/drain region 52 may be disposed in the first portion 22A, and the second portion P2 of the gate oxide layer 30 may be disposed on the second portion 22B of the first drift region 22. In some embodiments, the second portion 22B of the first drift region 22 may include a bottom BM1 protruding and extending toward the bottom surface S2, the bottom BM1 of the second portion 22B may be lower than the bottom surface and/or the bottommost surface of the first portion 22A in the vertical direction D1 accordingly, and the bottom BM3 of the second portion P2 of the gate oxide layer 30 may be located corresponding to and substantially overlap the bottom BM1 of the second portion 22B of the first drift region 22 when viewed in the vertical direction D1, but not limited thereto. In some embodiments, the second portion 22B of the first drift region 22 may be located under the first portion P1 and the second portion P2 of the gate oxide layer 30 in the vertical direction D1, and the second portion 22B of the first drift region 22 may surround the bottom BM3 of the second portion P2 of the gate oxide layer 30 in the horizontal direction D2. Additionally, a cross-sectional shape of the second portion 22B of the first drift region 22 may be substantially similar to a cross-sectional shape of the second portion P2 of the gate oxide layer 30 (such as a U-shaped structure or a V-shaped structure), but not limited thereto.

In some embodiments, the semiconductor device 101 may further include a second drift region 24 and a second source/drain region 54. The second drift region 24 may be disposed in the semiconductor substrate 10. The first drift region 22 and the second drift region 24 may be located at two opposite sides of the semiconductor substrate 10 disposed under the gate structure 40 (such as a channel region 10C illustrated in FIG. 1, but not limited thereto) in the horizontal direction D2, respectively, and the first drift region 22 may be separated from the second drift region 24. The second source/drain region 54 may be disposed in the second drift region 24, and the first source/drain region 52 and the second source/drain region 54 may be located at two opposite sides of the gate structure 40 in the horizontal direction D2, respectively. In addition, the gate oxide layer 30 may further include a third portion P3, and the third portion P3 may be disposed between the first portion P1 of the gate oxide layer 30 and the second source/drain region 54 in the horizontal direction D2. In some embodiments, the third portion P3 of the gate oxide layer 30 may include a bottom BM4 extending downwards and a second depressed top surface (such as a top surface TS4 shown in FIG. 1) located above the bottom BM4 of the third portion P3 of the gate oxide layer 30 in the vertical direction D1, and a part of the second drift region 24 may be located under the first portion P1 and the third portion P3 of the gate oxide layer 30 in the vertical direction D1.

In some embodiments, the second drift region 24 may include a first portion 24A and a second portion 24B. The first portion 24A may be directly connected with the second portion 24B, and the second portion 24B may be located between the gate structure 40 and the first portion 24A in the horizontal direction D2. Additionally, the second source/drain region 54 may be disposed in the first portion 24A, and the third portion P3 of the gate oxide layer 30 may be disposed on the second portion 24B of the second drift region 24. In some embodiments, the second portion 24B of the second drift region 24 may include a bottom BM2 protruding and extending toward the bottom surface S2, the bottom BM2 of the second portion 24B may be lower than the bottom surface and/or the bottommost surface of the first portion 24A in the vertical direction D1 accordingly, and the bottom BM4 of the third portion P3 of the gate oxide layer 30 may be located corresponding to and substantially overlap the bottom BM2 of the second portion 24B of the second drift region 24 when viewed in the vertical direction D1, but not limited thereto. In some embodiments, the second portion 24B of the second drift region 24 may be disposed under the first portion P1 and the third portion P3 of the gate oxide layer 30 in the vertical direction D1, and the second portion 24B of the second drift region 24 may surround the bottom BM4 of the third portion P3 of the gate oxide layer 30 in the horizontal direction D2. Additionally, a cross-sectional shape of the second portion 24B of the second drift region 24 may be substantially similar to a cross-sectional shape of the third portion P3 of the gate oxide layer 30 (such as a U-shaped structure or a V-shaped structure), but not limited thereto.

In some embodiments, the second portion P2 and the third portion P3 of the gate oxide layer 30 may be located at two opposite sides of the first portion P1 in the horizontal direction D2, respectively, and the first portion P1 may be directly connected with the second portion P2 and the third portion P3. In some embodiments, the second portion P2 of the gate oxide layer 30 may be disposed conformally on the second portion 22B of the first drift region 22, and the third portion P3 of the gate oxide layer 30 may be disposed conformally on the second portion 24B of the second drift region 24. Additionally, a bottom BM5 of the first portion P1 of the gate oxide layer 30 may be higher than the bottom BM3 of the second portion P2 and the bottom BM4 of the third portion P3 in the vertical direction D1, a top surface TS5 of the first portion P1 may be higher than the depressed top surface of the second portion P2 (such as the top surface TS3) and the depressed top surface of the third portion P3 (such as the top surface TS4) in the vertical direction D1, and a cross-sectional shape of the gate oxide layer 30 may be a W-shape structure substantially, but not limited thereto. In some embodiments, a thickness TK of the first portion P1 of the gate oxide layer 30 may substantially range from 200 angstroms to 300 angstroms, and a distance DS between the top surface TS5 of the first portion P1 and the bottom BM3 of the second portion P2 in the vertical direction D1 may range from 400 angstroms to 600 angstroms, but not limited thereto.

In some embodiments, the cross-sectional shape of the semiconductor device 101 may be regarded as a symmetric structure substantially. Therefore, the cross-sectional shape of the first drift region 22 and the cross-sectional shape of the second drift region 24 may be similar to each other and mutually symmetrical (such as being arranged with mirror symmetry using an axis AX penetrating through the gate structure 40 in the vertical direction D1 as the central axis), and the cross-sectional shape of the second portion P2 of the gate oxide layer 30 and the cross-sectional shape of the third portion P3 of the gate oxide layer 30 may be similar to each other and mutually symmetrical, but not limited thereto. Additionally, the two source/drain regions in the semiconductor device 101 may be a source region and a drain region respectively (the first source/drain region 52 may be a drain region while the second source/drain region 54 is a source region, or the first source/drain region 52 may be a source region while the second source/drain region 54 is a drain region, for example), and the semiconductor device 101 may be regarded as a double diffused drain MOS (DDDMOS) structure, but not limited thereto.

In some embodiments, the semiconductor substrate 10 may include a silicon substrate, an epitaxial silicon substrate, a silicon germanium substrate, a silicon carbide substrate, a silicon-on-insulator (SOI) substrate, or a substrate made of other suitable semiconductor materials. Additionally, the first drift region 22 and the second drift region 24 may include doped regions formed by performing a doping process (such as an implantation process) to the semiconductor substrate 10. The semiconductor substrate 10 may be a semiconductor substrate with a first conductivity type or include a first conductivity type region (such as a doped well region with the first conductive type, not illustrated), the first drift region 22 and the second drift region 24 may have a second conductivity type, and the second conductivity type may be complementary to the first conductivity type. For example, in this embodiment, the first conductivity type may be p-type, and the second conductivity type may be n-type, but not limited thereto. In other words, in some embodiments, the semiconductor substrate 10 may be a p-type semiconductor substrate or a semiconductor substrate including a p-type well region, and the first drift region 22 and the second drift region 24 may be n-type doped regions, or the semiconductor substrate 10 may be an n-type semiconductor substrate or a semiconductor substrate including an n-type well region, and the first drift region 22 and the second drift region 24 may be p-type doped regions. In some embodiments, the first source/drain region 52 and the second source/drain region 54 may include doped regions formed in the semiconductor substrate 10 by a doping process (such as an implantation process). In some embodiments, the conductivity type of the first source/drain region 52 and the second source/drain region 54 may be identical to the conductivity type of the first drift region 22 and the second drift region 24, but the dopant concentration of the first source/drain region 52 and the second source/drain region 54 may be higher than that of the first drift region 22 and the second drift region 24. For example, the first source/drain region 52 and the second source/drain region 54 may be n-type heavily doped regions, but not limited thereto.

In some embodiments, the gate oxide layer 30 may include silicon oxide or other suitable oxide dielectric materials. In some embodiments, the first portion P1, the second portion P2, and the third portion P3 of the gate oxide layer 30 may be formed by oxidizing different parts of the semiconductor substrate 10, the first drift region 22, and/or the second drift region 24, and the material composition of the first portion P1, the material composition of the second portion P2, and the material composition of the third portion P3 may be substantially identical to one another, but not limited thereto. In addition, the gate structure 40 may include a gate dielectric layer (not illustrated) and a gate material layer (not illustrated) disposed on the gate dielectric layer, the gate dielectric layer may include high dielectric constant (high-k) dielectric material or other suitable dielectric materials, and the gate material layer may include a non-metallic electrically conductive material (such as doped polysilicon) or a metallic electrically conductive material, such as a metal gate structure formed with a work function layer and a low electrical resistivity layer stacked with each other, but not limited thereto.

In some embodiments, the semiconductor device 101 may further include a spacer structure SP disposed on a sidewall of the gate structure 40, and the spacer structure SP may be disposed on the first portion P1, the second portion P2, and the third portion P3 of the gate oxide layer 30 in the vertical direction D1. The spacer structure SP may include a single layer or multiple layers of dielectric materials, such as silicon nitride, silicon oxynitride, or other suitable dielectric materials. For example, the spacer structure SP may include a first spacer 42 and a second spacer 44, the first spacer 42 may be disposed between the second spacer 44 and the gate structure 40, and the material composition of the first spacer 42 may be different from that of the second spacer 44, but not limited thereto. In some embodiments, the gate structure 40 and the first spacer 42 may be disposed on the top surface TS5 of the first portion P1 of the gate oxide layer 30 in the vertical direction D1, the second spacer 44 located between the gate structure 40 and the first source/drain region 52 in the horizontal direction D2 may be disposed on the top surface TS5 of the first portion P1 of the gate oxide layer 30 and the first depressed top surface of the second portion P2 of the gate oxide layer 30 (such as the top surface TS3), and the second spacer 44 located between the gate structure 40 and the second source/drain region 54 in the horizontal direction D2 may be disposed on the top surface TS5 of the first portion P1 of the gate oxide layer 30 and the second depressed top surface of the third portion P3 of the gate oxide layer 30 (such as the top surface TS4), but not limited thereto.

In some embodiments, the surface contour design of the gate oxide layer 30 including the first portion P1, the second portion P2, and the third portion P3 described above (such as the W-shaped structure described above) may be used to increase the strength for supporting the gate structure 40 and/or the spacer structure SP formed on the gate oxide layer 30 stably, and that is beneficial to the related manufacturing yield. Additionally, in some embodiments, the semiconductor device 101 may further include a first silicide layer 62 and a second silicide layer 64 disposed on the first source/drain region 52 and the second source/drain region 54, respectively. The first silicide layer 62 and the second silicide layer 64 may include electrically conductive silicide materials, such as metal silicide materials, but not limited thereto. The metal silicide described above may include cobalt-silicide, nickel-silicide, or other suitable metal silicide. In some embodiments, the first silicide layer 62 and the second silicide layer 64 may be directly connected with the second portion P2 and the third portion P3 of the gate oxide layer 30, respectively, but not limited thereto.

Figure 2:
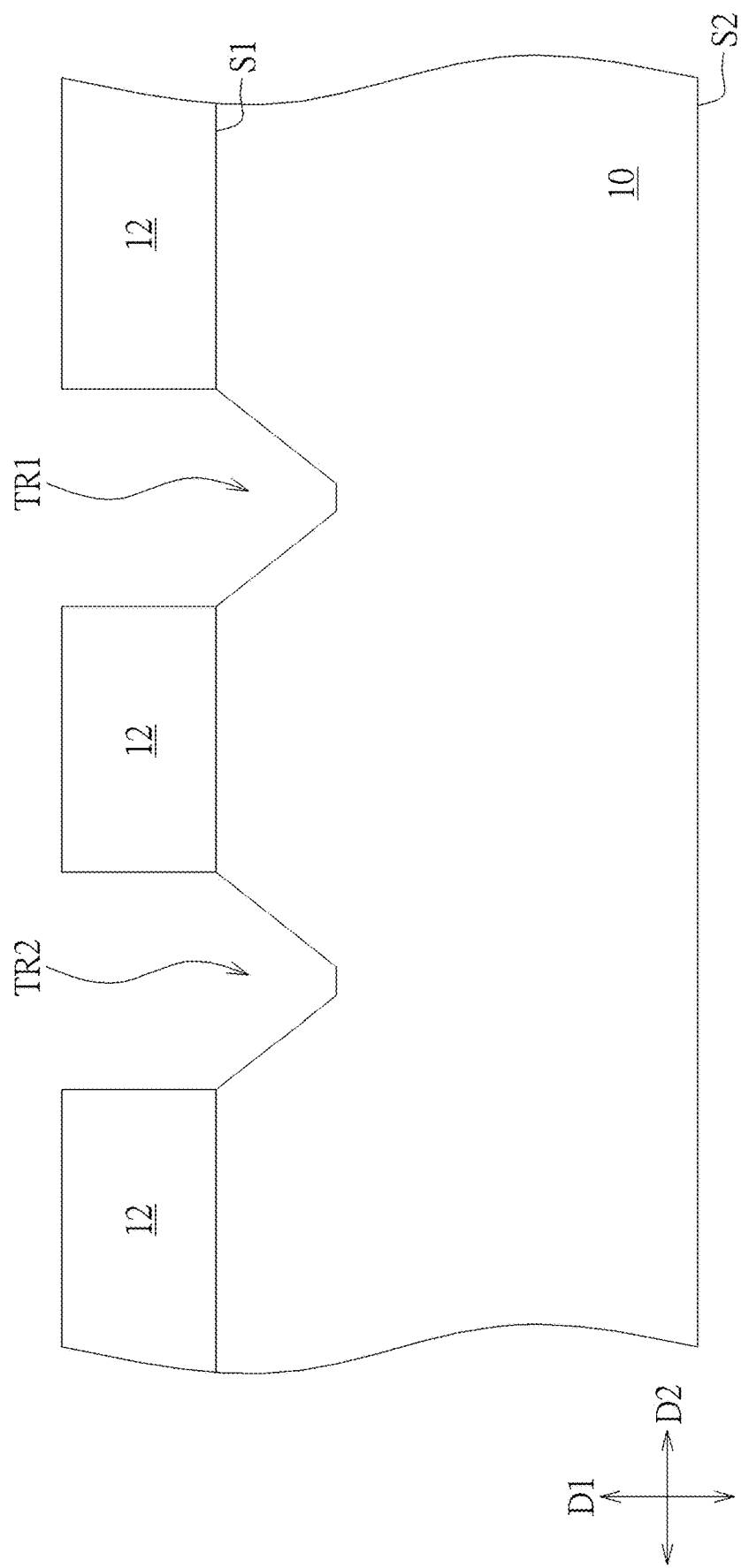
Figure 3:
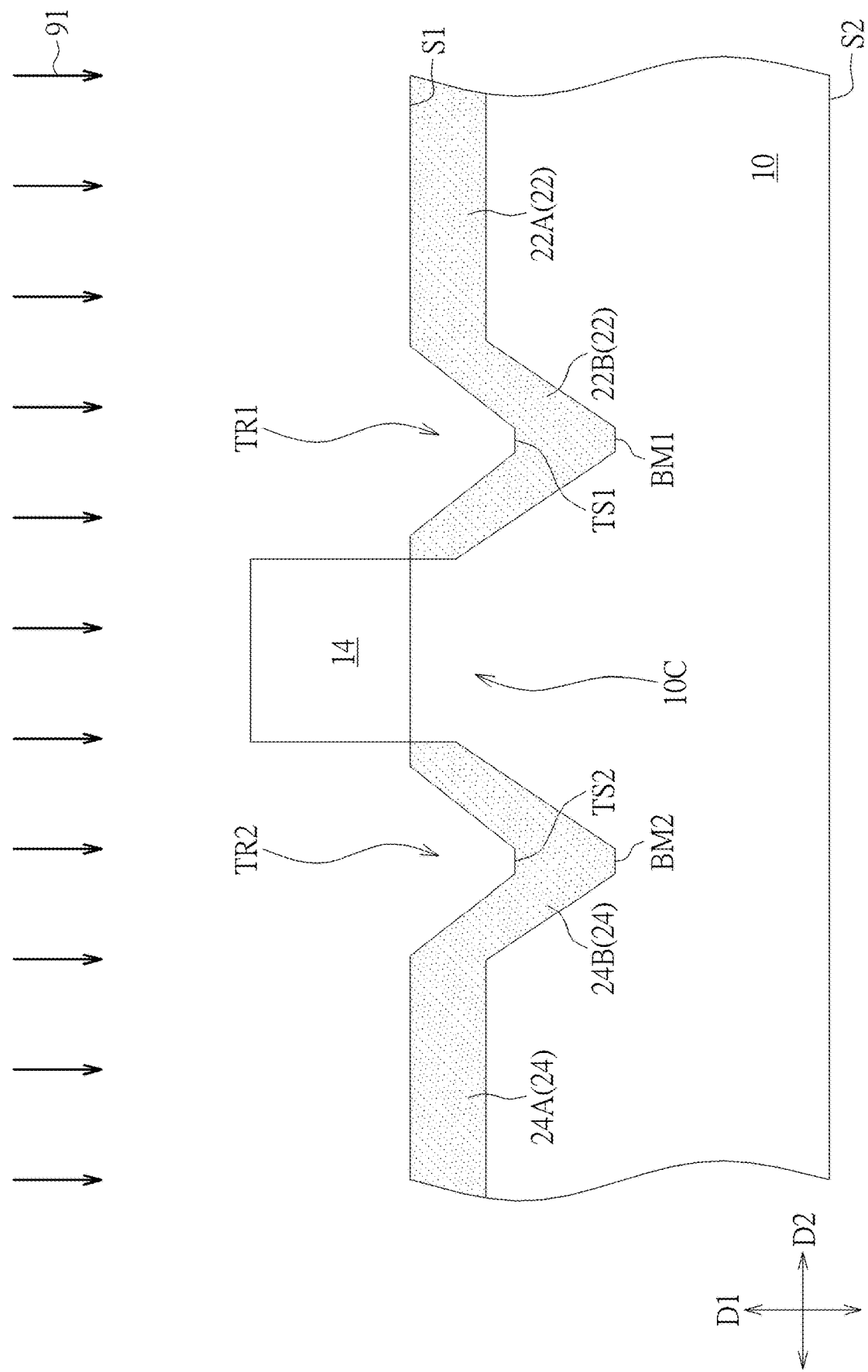
Figure 4:
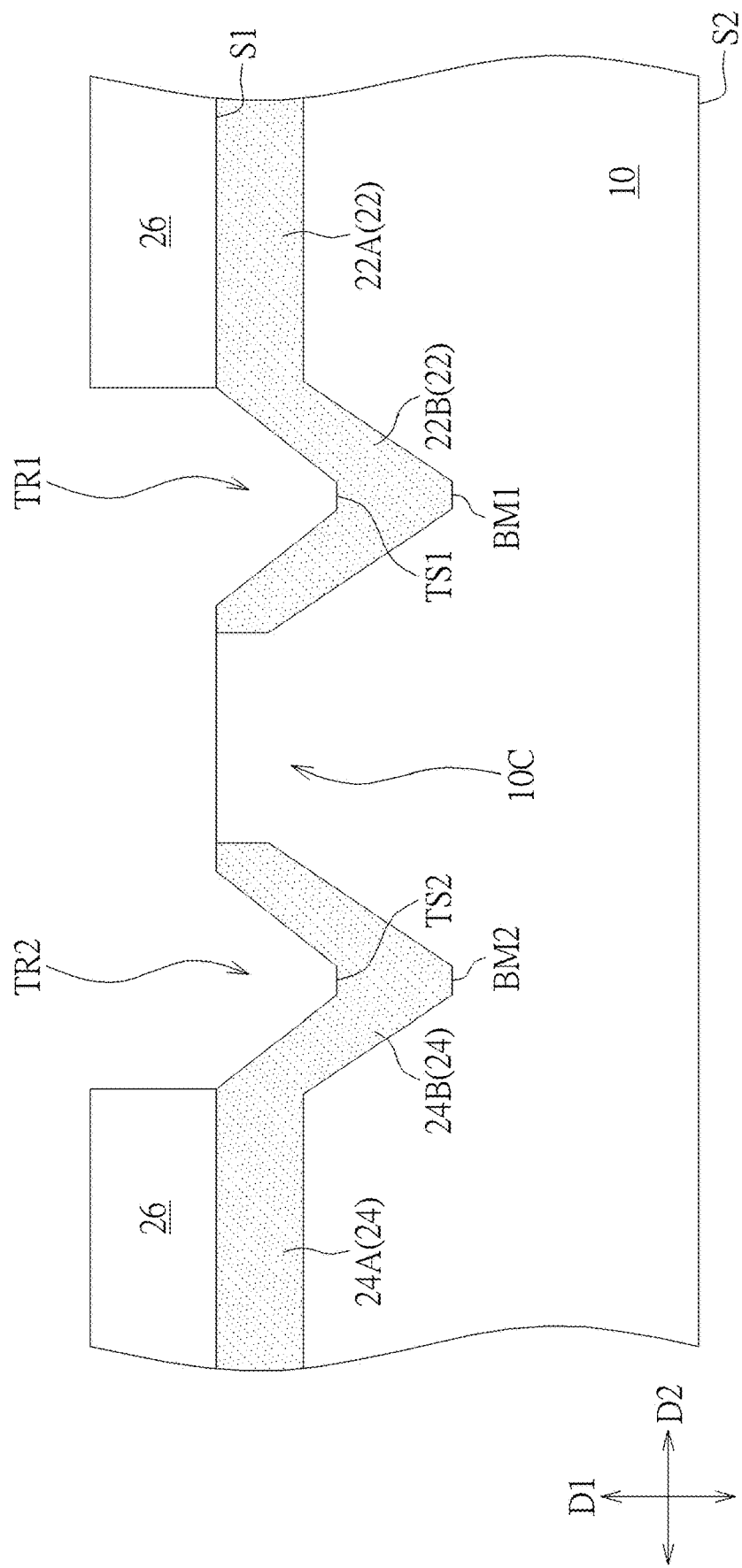
Figure 5:
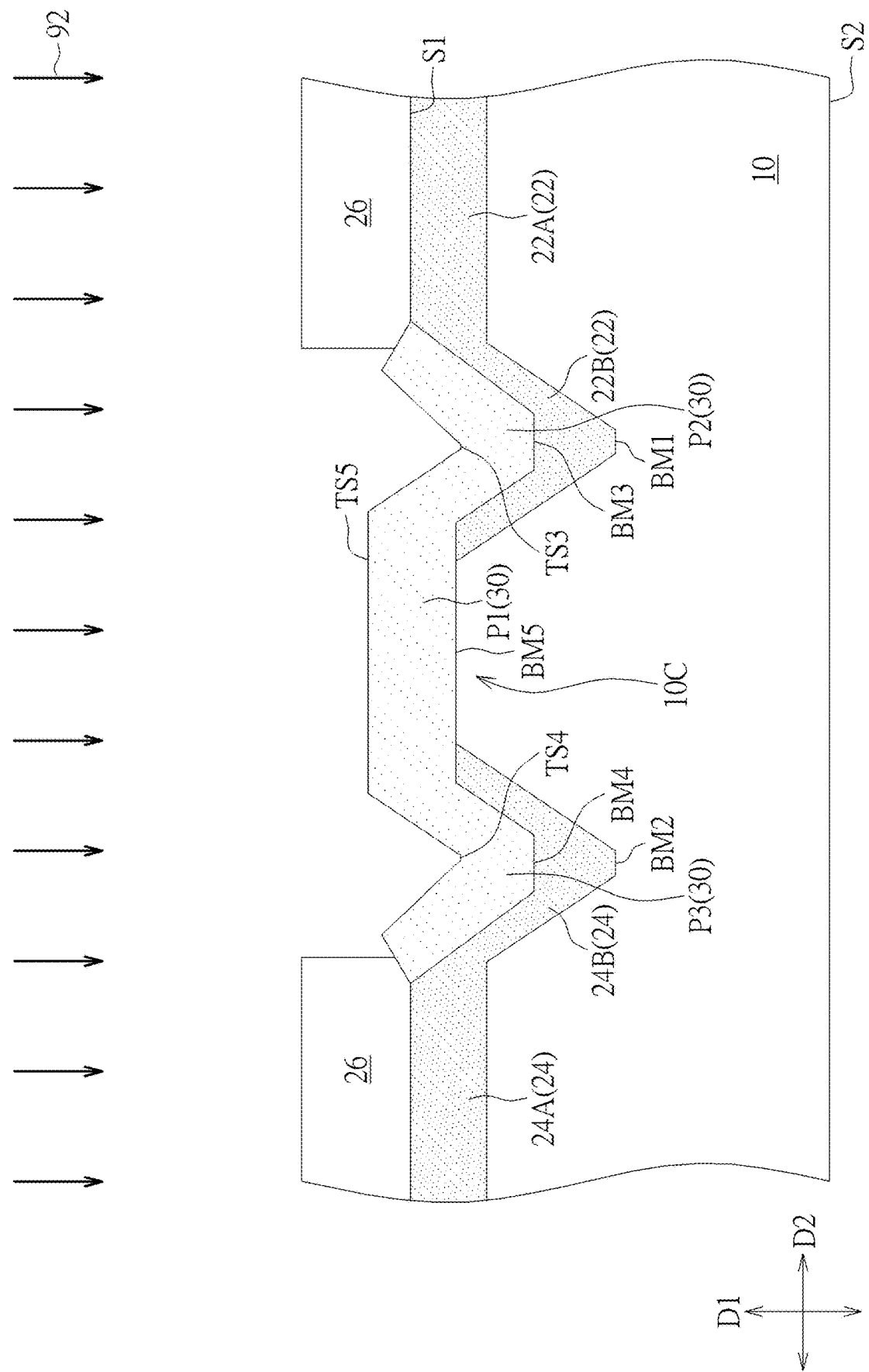
Figure 6:
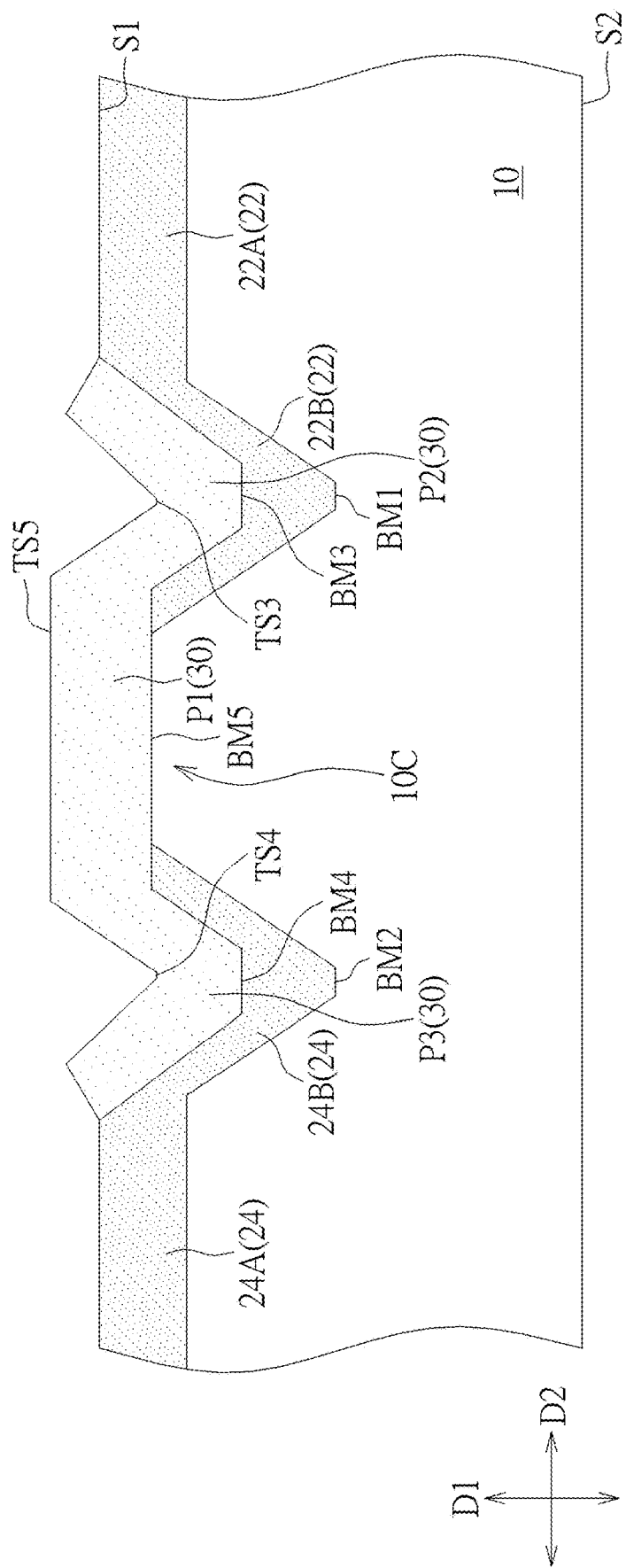
Figure 7:
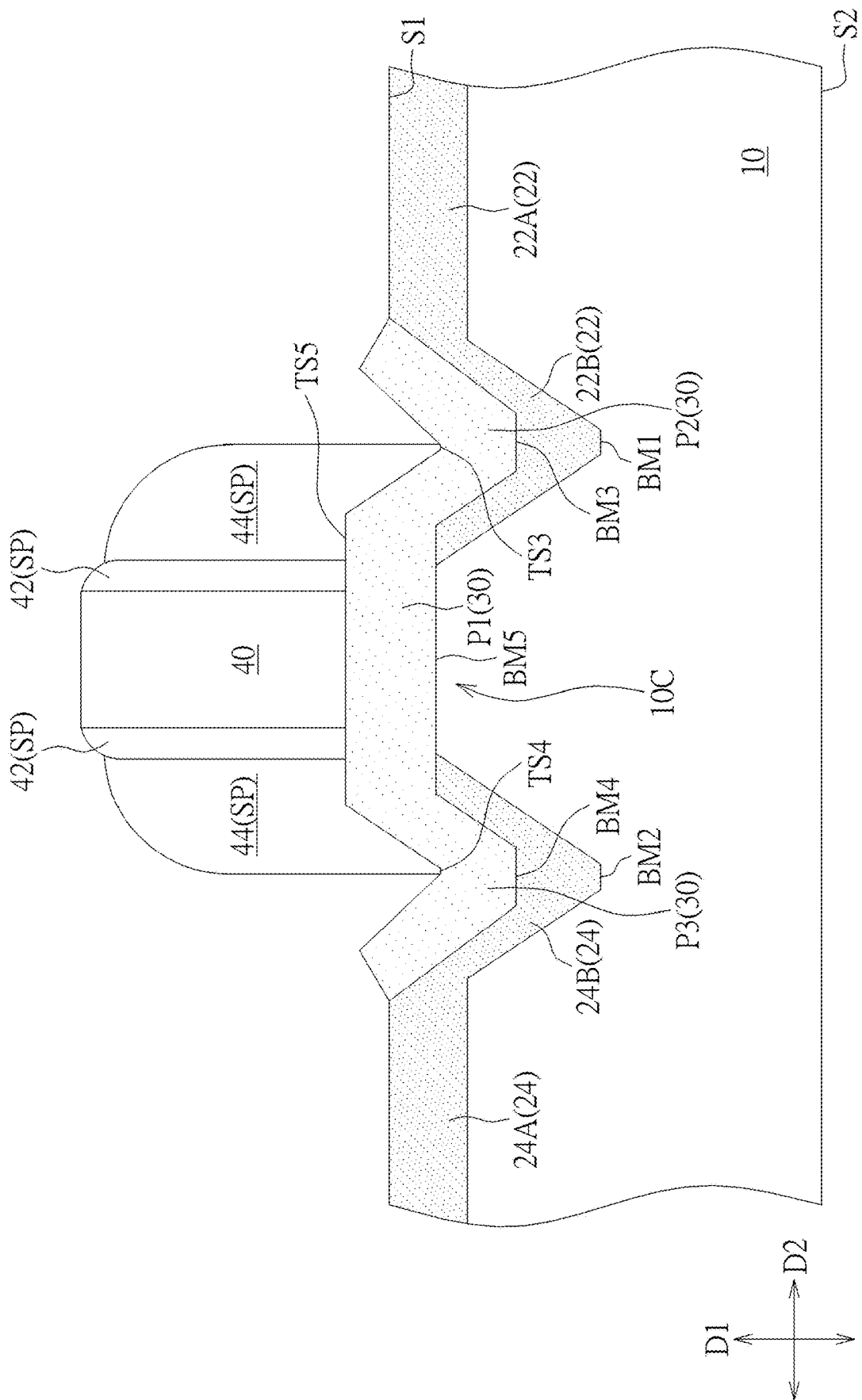

Please refer to FIGS. 1-7. FIGS. 2-7 are schematic drawings illustrating a manufacturing method of the semiconductor device according to the first embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, and FIG. 7 is a schematic drawing in a step subsequent to FIG. 6. In some embodiments, FIG. 1 may be regarded as a schematic drawing in a step subsequent to FIG. 7, but not limited thereto. As shown in FIG. 1, the manufacturing method of the semiconductor device 101 may include the following steps. Firstly, the first drift region 22 is formed in the semiconductor substrate 10. The gate oxide layer 30 is formed on the semiconductor substrate 10. The gate structure 40 is formed on the gate oxide layer 30, and the first drift region 22 is located at a side of the gate structure 40. The first source/drain region 52 is formed in the first drift region 22. The gate oxide layer 30 includes the first portion P1 and the second portion P2. At least a part of the first portion P1 is disposed between the gate structure 40 and the semiconductor substrate 10 in the vertical direction D1. The second portion P2 is disposed between the first portion P1 of the gate oxide layer 30 and the first source/drain region 52 in the horizontal direction D2. The second portion P2 of the gate oxide layer 30 includes the bottom BM3 extending downwards and the first depressed top surface (such as the top surface TS3) located above the bottom BM3 in the vertical direction D1. A part of the first drift region 22 is located under the first portion P1 and the second portion P2 of the gate oxide layer 30 in the vertical direction D1.

Specifically, the manufacturing method of the semiconductor device in this embodiment may include but is not limited to the following steps. As shown in FIG. 2, a patterned mask layer 12 may be formed on the top surface S1 of the semiconductor substrate 10, and an etching process using the patterned mask layer 12 as an etching mask may be performed to the semiconductor substrate 10 for forming trenches (such as a first trench TR1 and a second trench TR2) in the semiconductor substrate 10. The patterned mask layer 12 may include nitride (such as silicon nitride) or other suitable mask materials. As shown in FIG. 2 and FIG. 3, after the step of forming the first trench TR1 and the second trench TR2, the patterned mask layer 12 may be removed, and a patterned mask layer 14 may be formed on the semiconductor substrate 10. The patterned mask layer 14 may include a photoresist material or other suitable mask materials. Subsequently, a doping process 91 using the patterned mask layer 14 as a mask may be performed to the semiconductor substrate 10 for forming the first drift region 22 and the second drift region 24 in the semiconductor substrate 10. The doping process 91 may include an ion implantation process or other suitable doping approaches. In some embodiments, a portion of the semiconductor substrate 10 located between the first trench TR1 and the second trench TR2 in the horizontal direction D2 may be covered by the patterned mask layer 14, and after the step of forming the first drift region 22 and the second drift region 24, at least a part of the semiconductor substrate 10 located between the first drift region 22 and the second drift region 24 in the horizontal direction D2 may be regarded as a channel region 10C. Therefore, at least a part of the channel region 10C may be regarded as a region of the semiconductor substrate 10 covered by the patterned mask layer 14 during the doping process 91, but not limited thereto.

In some embodiments, a part of the first drift region 22 (such as the first portion 22A) may be formed under the top surface S1 of the semiconductor substrate 10 in the vertical direction D1, and another part of the first drift region 22 (such as the second portion 22B) may be formed under the first trench TR1 in the vertical direction D1 and located at two opposite sides of the first trench TR1 in the horizontal direction D2. Similarly, a part of the second drift region 24 (such as the first portion 24A) may be formed under the top surface S1 of the semiconductor substrate 10 in the vertical direction D1, and another part of the second drift region 24 (such as the second portion 24B) may be formed under the second trench TR2 in the vertical direction D1 and located at two opposite sides of the second trench TR2 in the horizontal direction D2. In some embodiments, the area distribution of the first drift region 22 and the second drift region 24 formed by the doping process 91 may be influenced by the first trench TR1 and the second trench TR2. For example, the shape of the bottom BM1 of the second portion 22B of the first drift region 22 may be similar to the shape of the first trench TR1, and the shape of the bottom BM2 of the second portion 24B of the second drift region 24 may be similar to the shape of the second trench TR2, but not limited thereto. In some embodiments, the second portion 22B of the first drift region 22 may have a depressed top surface (such as a top surface TS1 shown in FIG. 3), the top surface TS1 may be a surface of the first trench TR1, and the top surface TS1 and the bottom BM1 of the second portion 22B of the first drift region 22 may be disposed corresponding to each other in the vertical direction D1 and substantially overlap when viewed in the vertical direction D1. Similarly, the second portion 24B of the second drift region 24 may have a depressed top surface (such as a top surface TS2 shown in FIG. 3), the top surface TS2 may be a surface of the second trench TR2, and the top surface TS2 and the bottom BM2 of the second portion 24B of the second drift region 24 may be disposed corresponding to each other in the vertical direction D1 and substantially overlap when viewed in the vertical direction D1.

As shown in FIG. 3 and FIG. 4, after the step of forming the first drift region 22 and the second drift region 24, the patterned mask layer 14 may be removed and a patterned mask layer 26 may be formed on the semiconductor substrate 10. The patterned mask layer 26 may include nitride (such as silicon nitride) or other suitable mask materials. In some embodiments, the patterned mask layer 26 may cover the first portion 22A of the first drift region 22 and the first portion 24A of the second drift region 24 in the vertical direction D1, and the second portion 22B of the first drift region 22, the second portion 24B of the second drift region 24, and the channel region 10C may be not covered by the patterned mask layer 26 and be exposed. Subsequently, as shown in FIG. 4 and FIG. 5, after the step of forming the patterned mask layer 26, an oxidation process 92 may be performed for forming the gate oxide layer 30, and the oxidation process 92 may include a thermal oxidation process or other suitable oxidation approaches. In other words, the gate oxide layer 30 may be formed by the oxidation process 92 after the doping process 91 shown in FIG. 3 described above, and the second portion 22B of the first drift region 22, the second portion 24B of the second drift region 24, and the channel region 10C without being covered by the patterned mask layer 26 may be oxidized by the oxidation process 92 to become the gate oxide layer 30. For example, a part of the channel region 10C of the semiconductor substrate 10, a part of the first drift region 22 adjacent to the channel region 10C, and a part of the second drift region 24 adjacent to the channel region 10C may be oxidized by the oxidation process 92 to become at least a part of the first portion P1 of the gate oxide layer 30; a part of the first drift region 22 under the first trench TR1 may be oxidized by the oxidation process 92 to become at least a part of the second portion P2 of the gate oxide layer 30; and a part of the second drift region 24 under the second trench TR2 may be oxidized by the oxidation process 92 to become at least a part of the third portion P3 of the gate oxide layer 30, but not limited thereto.

In some embodiments, because of the difference between oxidation rates at different portions, the thickness of the first portion P1 of the gate oxide layer 30 (such as a distance between the top surface TS5 and the bottom BM5 in the vertical direction D1) may be different from the thickness of the second portion P2 (such as a distance between the top surface TS3 and the bottom BM3 in the vertical direction D1 or the shortest distance between the top surface TS3 and the bottom BM3 in the vertical direction D1) and/or the thickness of the third portion P3 (such as a distance between the top surface TS4 and the bottom BM4 in the vertical direction D1 or the shortest distance between the top surface TS4 and the bottom BM4 in the vertical direction D1), but not limited thereto. For example, the thickness of the first portion P1 of the gate oxide layer 30 may be greater than the thickness of the second portion P2 and/or the thickness of the third portion P3. Additionally, in some embodiments, because of the influence of the depths of the trenches described above, the top surface TS3 of the second portion P2 and/or the top surface TS4 o the third portion P3 may be lower than the bottom BM5 of the first portion P1 in the vertical direction D1, but not limited thereto. As shown in FIG. 5 and FIG. 6, after the step of forming the gate oxide layer 30, the patterned mask layer 26 may be removed for exposing the first portion 22A of the first drift region 22 and the first portion 24A of the second drift region 24. It is worth noting that, in the present invention, the manufacturing method for forming the first drift region 22, the second drift region 24, and the gate oxide layer 30 may include but is not limited to the steps shown in FIGS. 2-5 described above. In other words, other suitable manufacturing approaches may be used to form the first drift region 22, the second drift region 24, and the gate oxide layer 30 shown in FIG. 6 and FIG. 1 according to other design considerations.

Subsequently, as shown in FIG. 7, the gate structure 40 may be formed and the spacer structure SP may be formed on the sidewall of the gate structure 40. In some embodiments, the gate structure 40 may be formed on the top surface TS5 of the first portion P1 of the gate oxide layer 30, and the spacer structure SP may be formed on the first portion P1, the second portion P2, and the third portion P3 of the gate oxide layer 30 in the vertical direction D1. For example, the first spacer 42 may be formed on the top surface TS5 in the vertical direction D1, and the second spacer 44 may be partly formed on the top surface TS5 and partly formed on the top surface TS3 of the second portion P2 and the top surface TS4 of the third portion P3 in the vertical direction D1, but not limited thereto. In addition, a part of the second portion P2 of the gate oxide layer 30 may be disposed between the first portion 22A of the first drift region 22 and the second spacer 44 in the horizontal direction D2 for separating the spacer structure SP from the first portion 22A of the first drift region 22, and a part of the third portion P3 of the gate oxide layer 30 may be disposed between the first portion 24A of the second drift region 24 and the second spacer 44 in the horizontal direction D2 for separating the spacer structure SP from the first portion 24A of the second drift region 24.

As shown in FIG. 7 and FIG. 1, the first source/drain region 52 and the second source/drain region 54 may be formed in the first portion 22A of the first drift region 22 and the first portion 24A of the second drift region 24, respectively, and the first silicide layer 62 and the second silicide layer 64 may be formed on the first source/drain region 52 and the second source/drain region 54, respectively. In some embodiments, the first silicide layer 62 and the second silicide layer 64 may be formed by a self-aligned approach. Therefore, the first silicide layer 62 may be directly connected with the second portion P2 of the gate oxide layer 30 and separated from the spacer structure SP, and the second silicide layer 64 may be directly connected with the third portion P3 of the gate oxide layer 30 and separated from the spacer structure SP, but not limited thereto.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 8:
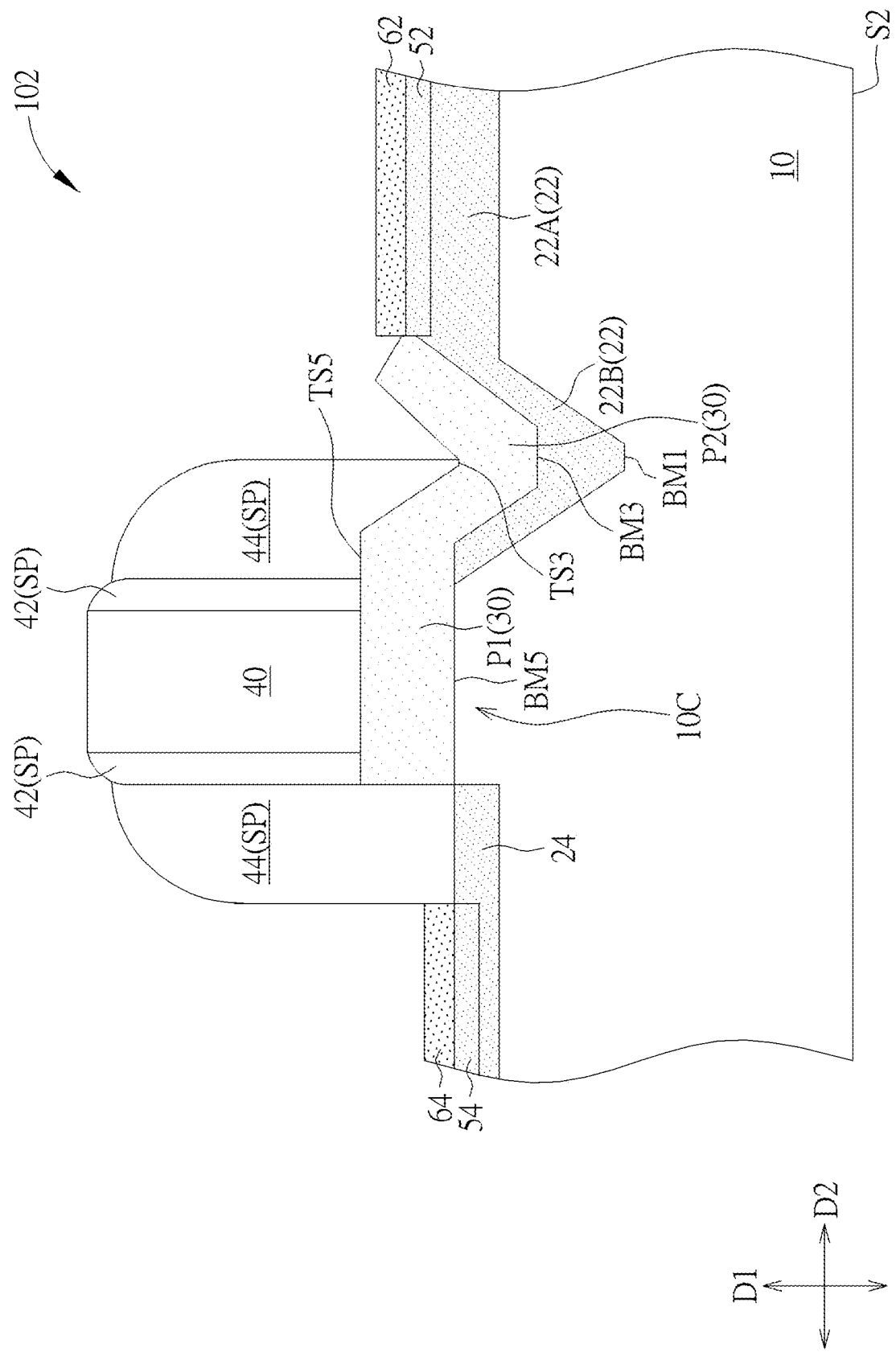
FIG. 8 is a schematic drawing illustrating a semiconductor device according to a second embodiment of the present invention.

Please refer to FIG. 8. FIG. 8 is a schematic drawing illustrating a semiconductor device 102 according to a second embodiment of the present invention. As shown in FIG. 8, in the semiconductor device 102, the gate oxide layer 30 may have the first portion P1 and the second portion P2 without the third portion described in the first embodiment. In addition, the second drift region 24 does not have a bottom extending downwards, and the bottom of the second drift region 24 may be higher than the bottom BM1 of the second portion 22B of the first drift region 22 and/or the bottom BM3 of the second portion P2 of the gate oxide layer 30 in the vertical direction D1 accordingly. In some embodiments, the first source/drain region 52 disposed in the first drift region 22 having the bottom BM1 protruding and extending toward the bottom surface S2 may be a drain region, and the second source/drain region 54 disposed in the second drift region 24 without a bottom protruding and extending toward the bottom surface S2 may be a source region, but not limited thereto. Additionally, a part of the second spacer 44 may be disposed between the first portion P1 of the gate oxide layer 30 and the second silicide layer 64 in the horizontal direction D2, and the second spacer 44 may directly contact the second silicide layer 64 and the second drift region 24, but not limited thereto.

Figure 9:
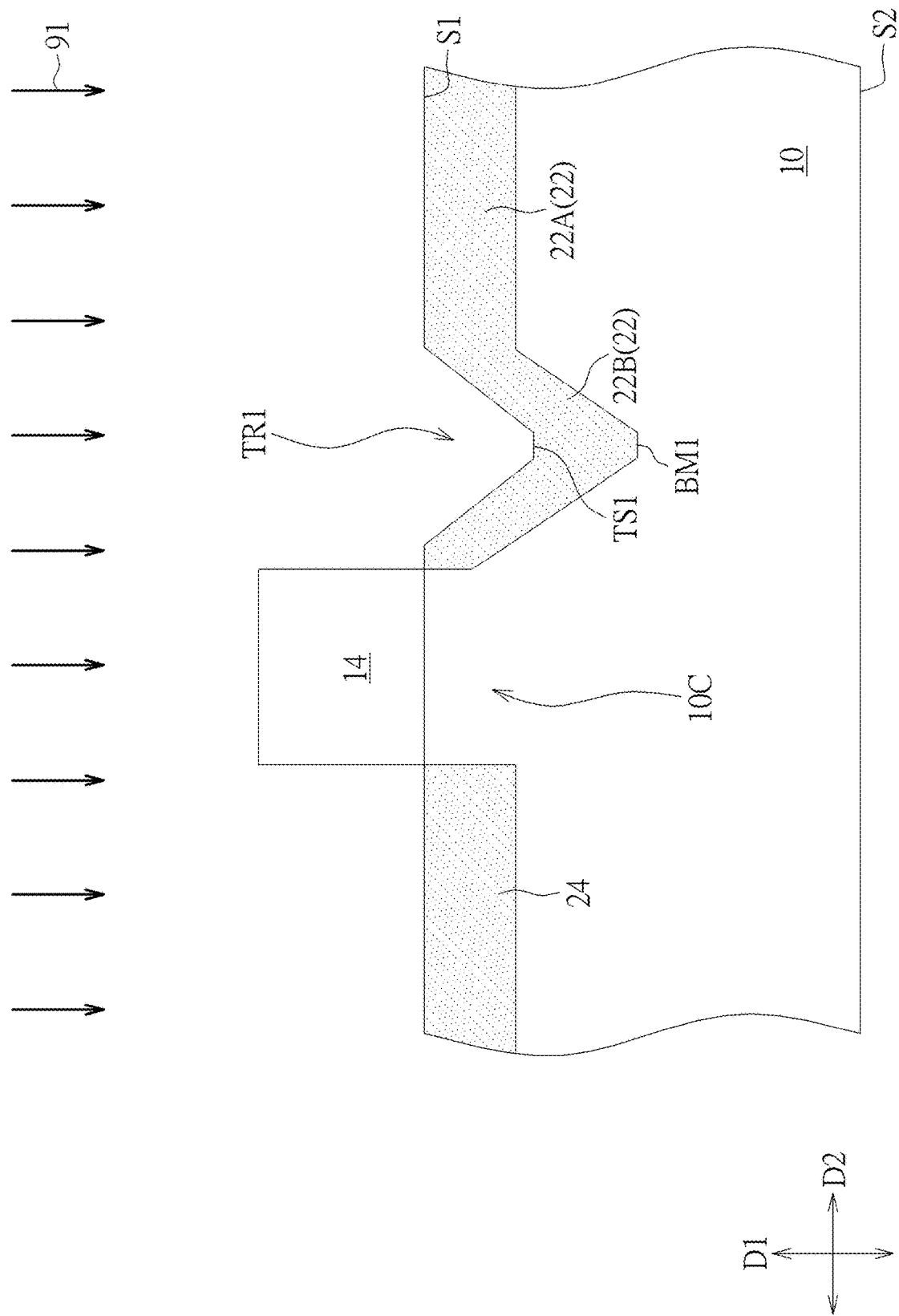
Figure 10:
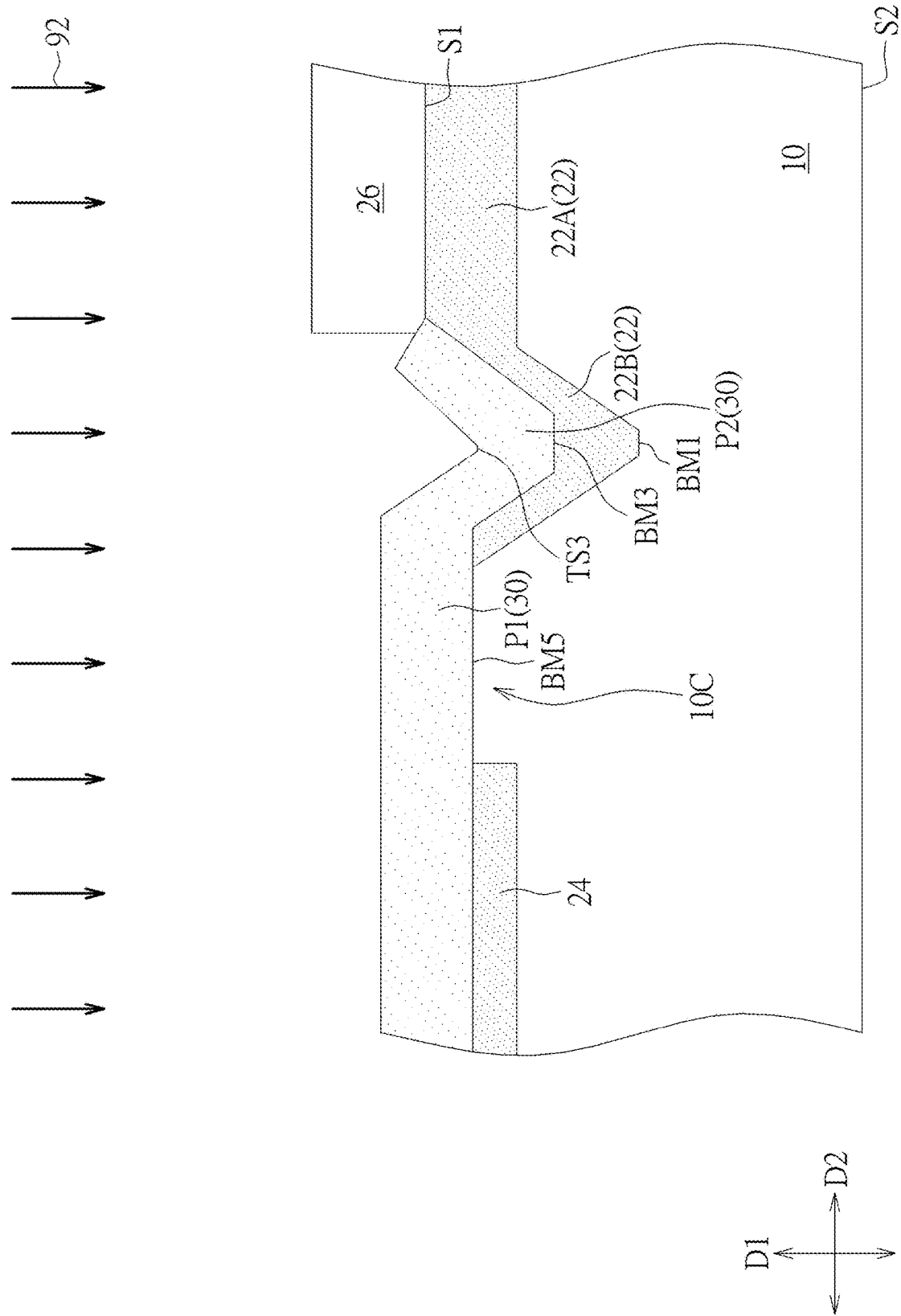

Please refer to FIGS. 8-10. FIG. 9 and FIG. 10 are schematic drawings illustrating a manufacturing method of the semiconductor device 102 according to the second embodiment of the present invention, and FIG. 10 is a schematic drawing in a step subsequent to FIG. 9. In some embodiments, FIG. 8 may be regarded as a schematic drawing in a step subsequent to FIG. 10, but not limited thereto. As shown in FIG. 9, in some embodiments, the first trench TR1 may be formed in the semiconductor substrate 10 before the doping process 91 without forming the second trench described in the first embodiment, and the second drift region 24 may not be formed under a trench accordingly. Subsequently, as shown in FIG. 9 and FIG. 10, the patterned mask layer 26 may cover the first portion 22A of the first drift region 22 without covering the second portion 22B of the first drift region 22, the channel region 10C, and the second drift region 24 during the oxidation process 92 because the second drift region 24 is not formed under a trench, and a part of the channel region 10C, a part of the second portion 22B of the first drift region 22, and a part of the second drift region 24, which are not covered by the patterned mask layer 26, may be oxidized by the oxidation process 92 to become the first portion P1 of the gate oxide layer 30, but not limited thereto. Subsequently, as shown in FIG. 10 and FIG. 8, the gate structure 40, the spacer structure SP, the first source/drain region 52, the second source/drain region 54, the first silicide layer 62, and the second silicide layer 64 may then be formed for forming the semiconductor device 102. In some embodiments, a part of the first portion P1 of the gate oxide layer 30 may be removed after the step of forming the first spacer 42, and a part of the second spacer 44 may be formed on the second drift region 24 accordingly and may be used as a mask in the processes of forming the second source/drain region 54 and the second silicide layer 64, but not limited thereto.

To summarize the above descriptions, according to the semiconductor device and the manufacturing method thereof in the present invention, the current path in the drift region located under the gate oxide layer may extend downwards in the vertical direction by the gate oxide layer including the bottom extending downwards and the depressed top surface located corresponding to the bottom. The electrical performance of the semiconductor device may be improved (such as reducing edge electrical field, enhancing endurance of hot carrier injection, and so forth) by elongating the current path accordingly, and/or the area occupied by the drift region and the area occupied by the semiconductor device may be relatively reduced under the requirement of a specific current path for increasing the amount and/or the distribution density of the semiconductor device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor device, comprising:
    forming a first drift region in a semiconductor substrate;
    forming a gate oxide layer on the semiconductor substrate;
    forming a gate structure on the gate oxide layer, wherein the first drift region is located at a side of the gate structure; and
    forming a first source/drain region in the first drift region, wherein the gate oxide layer comprises:
        a first portion, wherein at least a part of the first portion is disposed between the gate structure and the semiconductor substrate in a vertical direction; and
        a second portion disposed between the first portion of the gate oxide layer and the first source/drain region in a horizontal direction, wherein the second portion of the gate oxide layer comprises a bottom extending downwards and a first depressed top surface located above the bottom in a vertical direction, and a part of the first drift region is located under the first portion of the gate oxide layer and the second portion of the gate oxide layer in the vertical direction,
    wherein a method of forming the first drift region comprises:
        forming a first trench in the semiconductor substrate; and
        performing a doping process after the first trench is formed for forming the first drift region in the semiconductor substrate, wherein a part of the first drift region is formed under the first trench in the vertical direction and located at two opposite sides of the first trench in the horizontal direction, the gate oxide layer is formed by an oxidation process after the doping process, and a part of the first drift region under the first trench is oxidized by the oxidation process to become at least a part of the second portion of the gate oxide layer.

2. The manufacturing method of the semiconductor device according to claim 1, wherein a region of the semiconductor substrate is covered by a patterned mask layer during the doping process, and a part of the region of the semiconductor substrate is oxidized by the oxidation process to become at least a part of the first portion of the gate oxide layer.

3. The manufacturing method of the semiconductor device according to claim 1, wherein a bottom of the first portion of the gate oxide layer is higher than the bottom of the second portion of the gate oxide layer in the vertical direction.

4. The manufacturing method of the semiconductor device according to claim 1, further comprising:
    forming a second drift region in the semiconductor substrate, wherein the first drift region and the second drift region are located at two opposite sides of the semiconductor substrate located under the gate structure in the horizontal direction, respectively; and
    forming a second source/drain region in the second drift region, wherein the first source/drain region and the second source/drain region are located at two opposite sides of the gate structure in the horizontal direction, respectively, and the gate oxide layer further comprises:
        a third portion disposed between the first portion of the gate oxide layer and the second source/drain region in the horizontal direction, wherein the third portion of the gate oxide layer comprises a bottom extending downwards and a second depressed top surface located above the bottom of the third portion of the gate oxide layer in the vertical direction, and a part of the second drift region is located under the first portion of the gate oxide layer and the third portion of the gate oxide layer in the vertical direction.

5. The manufacturing method of the semiconductor device according to claim 4, wherein a method of forming the second drift region comprises:
    forming a second trench in the semiconductor substrate, wherein the doping process is performed after the first trench and the second trench are formed for forming the first drift region and the second drift region in the semiconductor substrate, and a part of the second drift region is formed under the second trench in the vertical direction and located at two opposite sides of the second trench in the horizontal direction.

6. The manufacturing method of the semiconductor device according to claim 5, wherein a part of the second drift region under the second trench is oxidized by the oxidation process to become at least a part of the third portion of the gate oxide layer.

7. The manufacturing method of the semiconductor device according to claim 1, further comprising:
    forming a spacer structure on a sidewall of the gate structure, wherein the spacer structure is formed on the first portion of the gate oxide layer and the second portion of the gate oxide layer in the vertical direction.

8. The manufacturing method of the semiconductor device according to claim 7, wherein a part of the spacer structure is formed on the first depressed top surface of the second portion of the gate oxide layer in the vertical direction.

* * * * *